United States Patent
Shimoaoki et al.

(10) Patent No.: US 10,108,111 B1
(45) Date of Patent: Oct. 23, 2018

(54) DEVELOPING METHOD, DEVELOPING APPARATUS, AND STORAGE MEDIUM

(71) Applicant: TOKYO ELECTRON LIMITED, Tokyo (JP)

(72) Inventors: Takeshi Shimoaoki, Kumamoto (JP); Yusaku Hashimoto, Kumamoto (JP); Masahiro Fukuda, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/936,818

(22) Filed: Mar. 27, 2018

(30) Foreign Application Priority Data

Mar. 30, 2017 (JP) .................... 2017-068405

(51) Int. Cl.
    *G03D 5/00* (2006.01)
    *G03G 15/10* (2006.01)

(52) U.S. Cl.
    CPC ......... *G03G 15/105* (2013.01); *G03G 15/108* (2013.01)

(58) Field of Classification Search
    USPC ....................................................... 396/611
    See application file for complete search history.

(56) References Cited

U.S. PATENT DOCUMENTS

| | | | | |
|---|---|---|---|---|
| 8,256,370 | B2* | 9/2012 | Kitano | G03F 7/162 118/320 |
| 2003/0077083 | A1* | 4/2003 | Yamamoto | B05C 5/0208 396/611 |
| 2007/0253709 | A1* | 11/2007 | Yoshihara | G03D 5/00 396/611 |
| 2016/0026086 | A1* | 1/2016 | Fukuda | G03F 7/30 355/27 |

FOREIGN PATENT DOCUMENTS

JP             201629703 A      3/2016

* cited by examiner

*Primary Examiner* — Rodney Fuller
(74) *Attorney, Agent, or Firm* — Nath, Goldberg & Meyer; Jerald L. Meyer

(57) ABSTRACT

A developing method includes: horizontally holding a substrate; disposing an opposing surface of a developer nozzle that faces a portion of a surface of the substrate, above one of central and peripheral portions of the surface; discharging a developer to form a liquid collection portion of the developer; spreading the liquid collection portion by moving the developer nozzle toward the other of the central and peripheral portions with the opposing surface brought into contact with the liquid collection portion; lifting the developer nozzle relative to the surface while stopping the discharge of the developer, and pulling up a portion of the liquid collection portion; stopping the lifting, and forming a pillar of the developer having a tapered upper end which is brought into contact with the opposing surface; and applying a shearing force to the pillar to shear the tapered upper end and separating the pillar from the opposing surface.

15 Claims, 12 Drawing Sheets

DEVELOPING METHOD, DEVELOPING APPARATUS, AND STORAGE MEDIUM

CROSS-REFERENCE TO RELATED APPLICATION

This application claims the benefit of Japanese Patent Application No. 2017-068405, filed on Mar. 30, 2017, in the Japan Patent Office, the disclosure of which is incorporated herein in its entirety by reference.

TECHNICAL FIELD

The present disclosure relates to a technique for developing a substrate for manufacturing a semiconductor device.

BACKGROUND

In photolithography in a manufacturing process of a semiconductor device, a resist film is formed on a surface of a semiconductor wafer (hereinafter, referred to as a wafer) which is a substrate, and subsequently the resist film is exposed. This exposure is carried out by relatively moving a mask opened along a circuit pattern with respect to the surface of the wafer and intermittently irradiating the wafer with light through the mask. After the exposure, a developer is supplied to the wafer to form a resist pattern.

Incidentally, with the progress of miniaturization of a critical dimension (CD) of the resist pattern, uniformity of the CD needs to be improved in each portion of the plane of the wafer. In this regard, a developer nozzle may be configured to have an opposing surface that faces the surface of the wafer and a discharge port opened toward the surface of the wafer in the opposing surface, the developer nozzle is moved along the surface of the wafer under rotation in a state where a liquid collection portion formed by discharging the developer is brought into contact with the opposing surface, and the liquid collection portion spreads over the entire surface of the wafer, thus performing a developing process. In such a method, the developer flows due to the movement of the developer nozzle which is in contact with the liquid collection portion and the rotation of the wafer. As such, the developer spreads while being stirred. This enhances the uniformity of the concentration of the developer and improves the uniformity of the CD.

However, after the liquid collection portion of the developer is spread over the surface of the wafer, the developer nozzle is lifted to be away from the surface of the wafer and moves away from the liquid collection portion. In this case, there may be a case in which a liquid droplet of the developer contributes to form the liquid collection portion adheres to the opposing surface. Thereafter, the liquid droplet drops onto the surface of the wafer, which may result in deterioration in the uniformity of the CD or cause development defects.

SUMMARY

Some embodiments of the present disclosure provide to a technique for preventing the occurrence of an abnormality which is caused when a developer drops from a developer nozzle onto a substrate for manufacturing a semiconductor device, wherein the developer nozzle is in contact with a liquid collection portion of the developer formed on the substrate so as to develop the substrate with a resist film formed thereon and having been exposed.

According to one embodiment of the present disclosure, there is provided a developing method including: horizontally holding a substrate for manufacturing a semiconductor device, wherein the substrate has a resist film formed on a surface thereof which has been exposed; disposing an opposing surface of a developer nozzle that faces a portion of the surface of the substrate, above one of a central portion and a peripheral portion of the surface of the substrate; discharging a developer from a discharge port formed to be opened downward from the opposing surface to form a liquid collection portion of the developer to be in contact with the opposing surface; spreading the liquid collection portion by moving the developer nozzle along the surface of the substrate under rotation toward the other of the central portion and the peripheral portion of the substrate with the opposing surface brought into contact with the liquid collection portion; lifting the developer nozzle relative to the surface of the substrate in a state in which the discharge of the developer from the discharge port is stopped, and pulling up a portion of the liquid collection portion below the discharge port by a surface tension of the developer; stopping the lifting the developer nozzle, and forming a pillar of the developer, which has an upwardly-tapered upper end, wherein the upwardly-tapered upper end is brought into contact with the opposing surface by the pulled-up portion of the liquid collection portion; and applying a shearing force to the pillar of the developer to shear the upwardly-tapered upper end of the pillar of the developer and separating the pillar of the developer from the opposing surface.

According to another embodiment of the present disclosure, there is provided a developing apparatus including: a substrate holding part configured to horizontally hold a substrate for manufacturing a semiconductor device, wherein the substrate has a resist film formed on a surface thereof which has been exposed; a rotating mechanism configured to rotate the substrate held by the substrate holding part; a developer nozzle having an opposing surface formed to face a portion of the surface of the substrate, and a discharge port of a developer, which is formed to be opened downward to face the opposing surface; a movement mechanism configured to move the development nozzle along the surface of the substrate; a relative elevating mechanism configured to elevate the developer nozzle relative to the substrate; and a controller configured to output a control signal to execute operations of: disposing the opposing surface above one of a central portion and a peripheral portion of the surface of the substrate held by the substrate holding part; discharging the developer from a discharge port opened in the opposing surface to form a liquid collection portion of the developer to be in contact with the opposing surface; spreading the liquid collection portion by moving the developer nozzle along the surface of the substrate under rotation toward the other of the central portion and the peripheral portion of the substrate with the opposing surface brought into contact with the liquid collection portion; lifting the developer nozzle relative to the surface of the substrate in a state in which the discharge of the developer from the discharge port is stopped, and pulling up a portion of the liquid collection portion below the discharge port by a surface tension of the developer; stopping the lifting the developer nozzle, and forming a pillar of the developer, which has an upwardly-tapered upper end, wherein the upwardly-tapered upper end is brought into contact with the opposing surface by the pulled-up portion of the liquid collection portion; and applying a shearing force to the pillar of the developer to shear the upwardly-tapered upper end of the pillar of the developer and separating the pillar of the developer from the opposing surface.

According to another embodiment of the present disclosure, there is provided a non-transitory computer-readable storage medium that stores a computer program used in a developing apparatus which develops a substrate for manufacturing a semiconductor device, wherein the substrate has a resist film formed on a surface thereof and has been exposed, wherein the computer program is organized with a group of steps for performing the aforementioned developing method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A developing apparatus 1 according to an embodiment of the present disclosure will be described with reference to a longitudinal sectional side view of FIG. 1 and a transverse plan view of FIG. 2. The developing apparatus 1 performs a developing process on a wafer W, which is a circular substrate for manufacturing a semiconductor device with a negative resist film formed thereon. The resist film has been exposed along a pattern in an exposure device, before being transferred to the developing apparatus 1.

Figure 1:
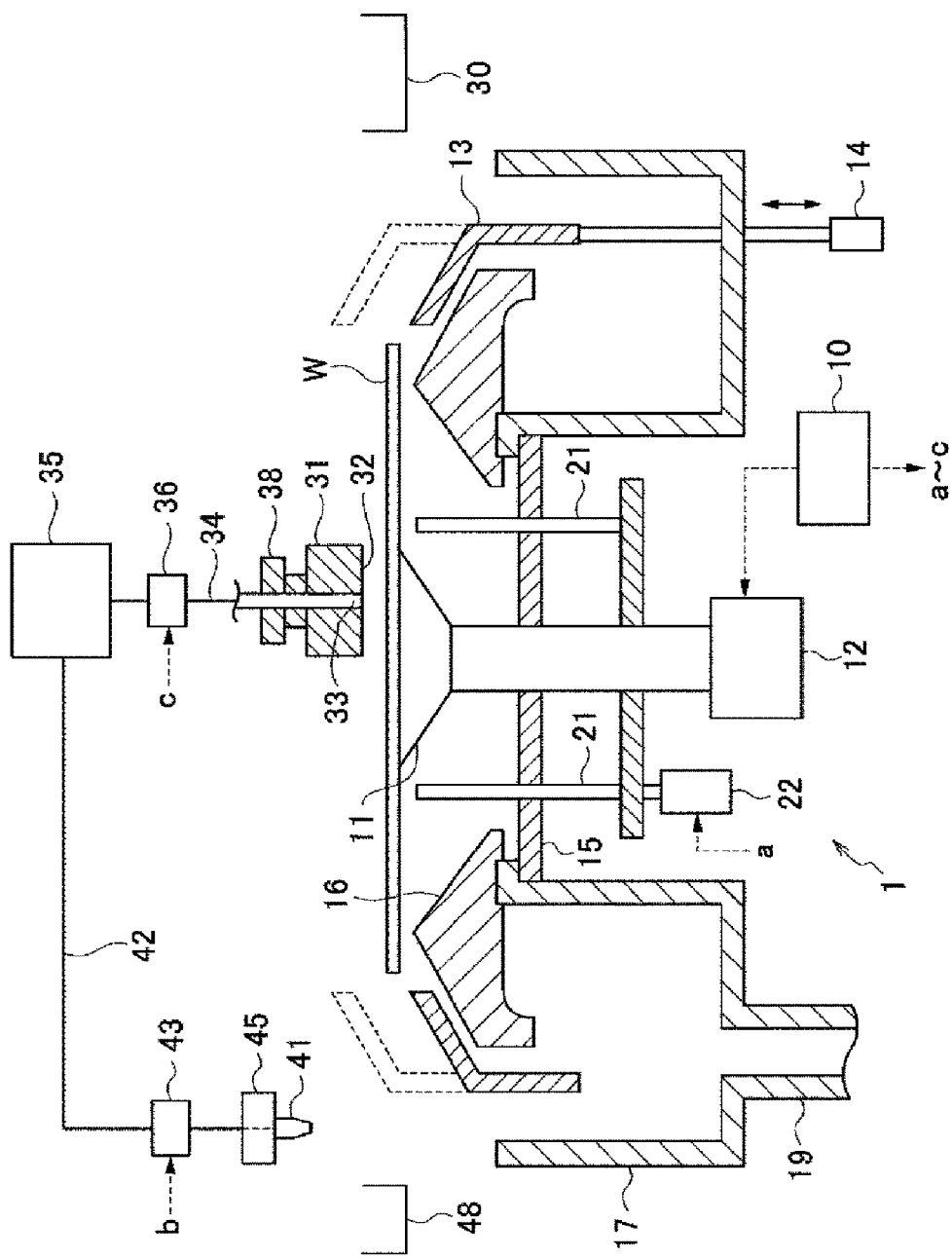
FIG. 1 is a longitudinal sectional side view showing a developing apparatus according to the present disclosure.

In FIG. 1, reference numeral 11 denotes a spin chuck serving as a substrate holding part, which makes contact with a central portion of a back surface of the wafer W and holds the wafer W horizontally. In FIG. 1, reference numeral 12 denotes a rotating mechanism. The rotating mechanism 12 rotates the spin chuck 11 so that the wafer W held by the spin chuck 11 rotates around a center axis of the wafer W. In FIG. 1, reference numeral 13 denotes a liquid-receiving cup formed in an upwardly-extending cylindrical shape. An upper portion of the liquid-receiving cup 13 is inclined inward. In FIG. 1, reference numeral 14 denotes an elevating mechanism. The elevating mechanism 14 moves upward and downward the liquid-receiving cup 13 between a transfer position (position indicated by a solid line in FIG. 1) at which the wafer W is transferred to and from the spin chuck 11 and a process position (position indicated by a dotted line in FIG. 1) at which the wafer W is subjected to the developing process. In addition, a circular plate 15 is provided below the wafer W held by the spin chuck 11. A guide member 16 having a vertical cross section of a mountain shape is provided in a ring shape at the outer side of the circular plate 15. The guide member 16 is configured to guide a developing solution dropping from the wafer W to a liquid-receiving part 17 installed outside the circular plate 15.

The liquid-receiving part 17 is configured as a recess formed annularly so as to surround the spin chuck 11, and is connected to a waste liquid part (not shown) via a drain pipe 19. In FIG. 1, reference numeral 21 denotes elevating pins for transferring the wafer W between the spin chuck 11 and a substrate transfer mechanism (not shown). In FIG. 1, reference numeral 22 denotes an elevating mechanism for elevating the elevating pins 21.

In FIG. 1, reference numeral 31 denotes a developer nozzle for supplying a developer to the wafer W to form a liquid collection portion. The developer nozzle 31 is formed in a vertical flat columnar shape. A lower surface 32 of the developer nozzle 31 is a circular horizontal surface smaller than the surface of the wafer W in size. The lower surface 32 constitutes an opposing surface that faces a portion of the surface of the wafer W when the developing process is performed. A discharge port 33 of the developer is formed at the center of the lower surface 32 so as to be opened downward in a vertical direction. In a state in which the lower surface 32 is brought into contact with the liquid collection portion of the developer discharged from the discharge port 33, the developer nozzle 31 horizontally moves on the wafer W under rotation so that the wafer W is subjected to the developing process. The developer constituting the liquid collection portion is stirred and flows between the lower surface 32 and the surface of the wafer W due to an interfacial tension acting on each of the lower surface 32 and the surface of the wafer W, so that concentration of the developer is made uniform. In this manner, the developing process is performed while the concentration of the developer is made to be uniform, whereby uniformity of critical dimension (CD) of a pattern formed in a plane of the wafer W is achieved.

The discharge port 33 is connected to a supply source 35 in which a developer for developing a negative resist is stored via a developer supply pipe 34. Reference numeral 36 in FIG. 1 denotes a developer supply mechanism installed in the developer supply pipe 34. The developer supply mechanism 36 is constituted by a valve and a mass flow controller, and adjusts a flow rate of the developer supplied from the supply source 35 to the developer nozzle 31. Reference numeral 37 in FIG. 2 denotes a driving mechanism. The driving mechanism 37 supports the developer nozzle 31 via an arm 38. The driving mechanism 37 is configured to be linearly movable in a horizontal direction along the guide 39. With the horizontal movement of the driving mechanism 37, the discharge port 33 of the developer nozzle 31 moves on the diameter of the wafer W. Further, the driving mechanism 37 is configured to elevate the developer nozzle 31 along the vertical axis via the arm 38. Accordingly, the driving mechanism 37 serves as a horizontal moving mechanism for horizontally moving the developer nozzle 31 and a relative elevating mechanism for elevating the developer nozzle 31 relative to the wafer W.

When viewed in a plan view, a standby part 30 where the developer nozzle 31 is on stand when it does not perform the developing process on the wafer W is provided outside the liquid-receiving cup 13. The standby part 30 is formed in a cup shape having an opened upper portion. With the horizontal movement and the elevating movement of the driving mechanism 37, the developer nozzle 31 can move between the inside of the cup of the standby part 30 and above the wafer W. A cleaning liquid is supplied into the cup of the standby part 30 to clean the developer nozzle 31.

Figure 2:
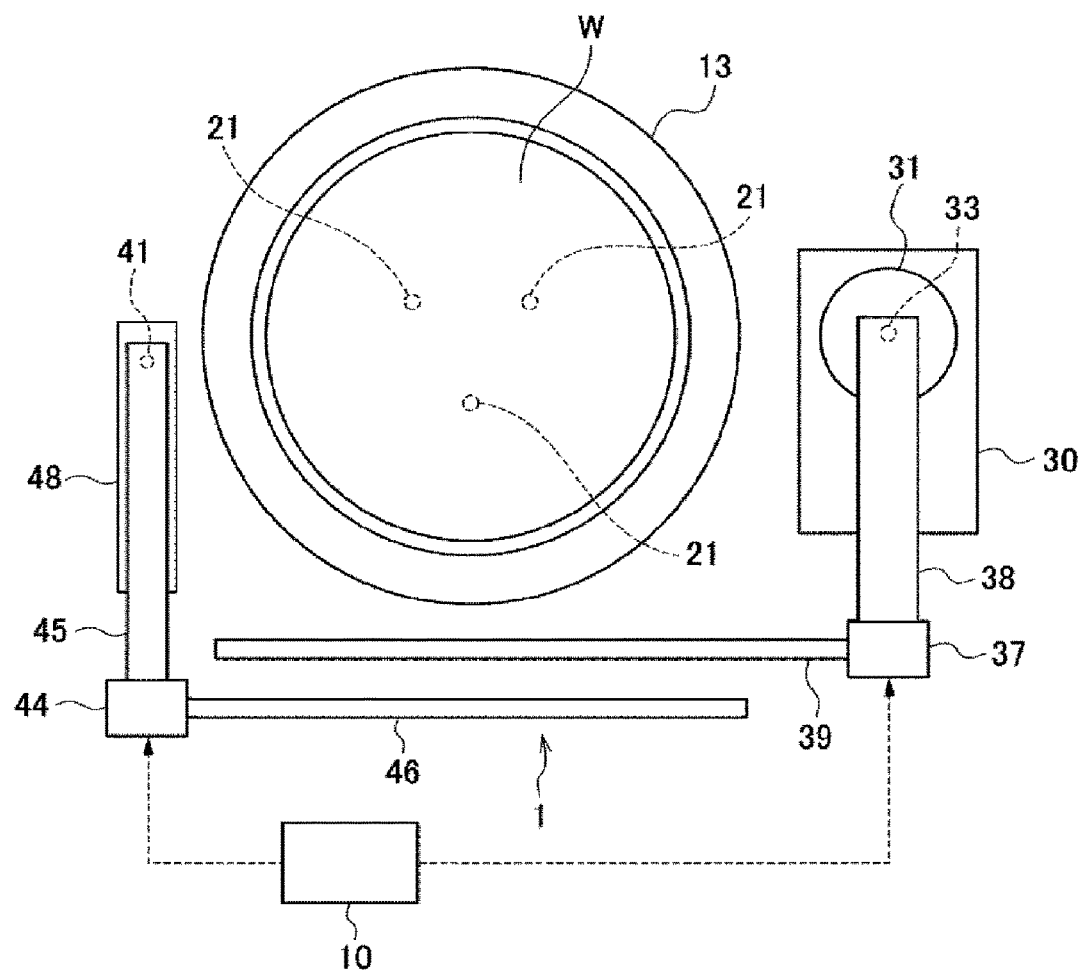
FIG. 2 is a plan view of the developing apparatus.

In FIGS. 1 and 2, reference numeral 41 denotes a developer nozzle which discharges a developer vertically downward. The developer nozzle 41 supplies the developer to the surface of the wafer W before forming the liquid collection portion of the developer by the developer nozzle 31, and performs a pre-wetting process to increase the wettability of the developer supplied from the developer nozzle 31. The developer nozzle 41 is connected to the supply source 35 via a developer supply pipe 42. A supply mechanism 43 configured similarly to the supply mechanism 36 is provided in the developer supply pipe 42 to adjust a flow rate of the developer supplied to the developer nozzle 41.

Figure 4:
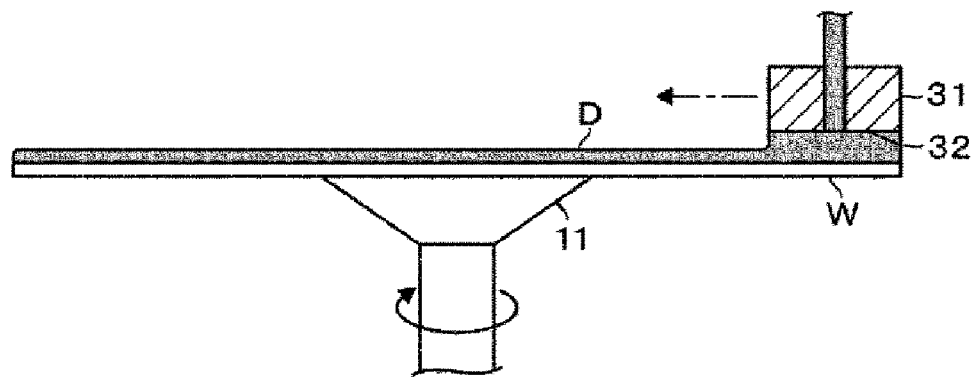
FIG. 4 is a process chart showing a process of the embodiment performed by the developing apparatus of the present disclosure.

Reference numeral 44 in FIG. 2 denotes a driving mechanism. The driving mechanism 44 is configured similarly to the driving mechanism 37 and configured to move the developer nozzle 41 in horizontal and vertical directions via an arm 45 supporting the developer nozzle 41. Reference numeral 46 in FIG. 4 is a guide along which the driving mechanism 44 moves horizontally. In FIGS. 1 and 2, reference numeral 48 denotes a standby part where the developer nozzle 41 is on stand when it does not perform the developing process on the wafer W. The standby part 48 is configured similarly to the standby part 30 and is provided outside the liquid-receiving cup 13 when viewed in a plan view. With the horizontal movement and the elevating movement of the driving mechanism 44, the developer nozzle 41 can move between the inside of the standby part 48 and above the central portion of the wafer W.

The developing apparatus 1 is provided with a control part 10 which is a computer. The control part 10 includes a program storage part (not shown). The program storage part stores a program which incorporates commands (a group of steps) so as to perform the developing process (to be described later). According to this program, the control part 10 outputs control signals to each part of the developing apparatus 1 to control the operation of each part. Specifically, the respective operations such as the number of rotations of the wafer W, the horizontal movement and the elevating movement of each of the developer nozzles 31 and 41, the supply of the developer to the developer nozzles 31 and 41, and the like are controlled. The program is stored in the program storage part while being stored in a storage medium such as a hard disk, a compact disk, a magneto-optical disk, a memory card, or the like.

Figure 3:
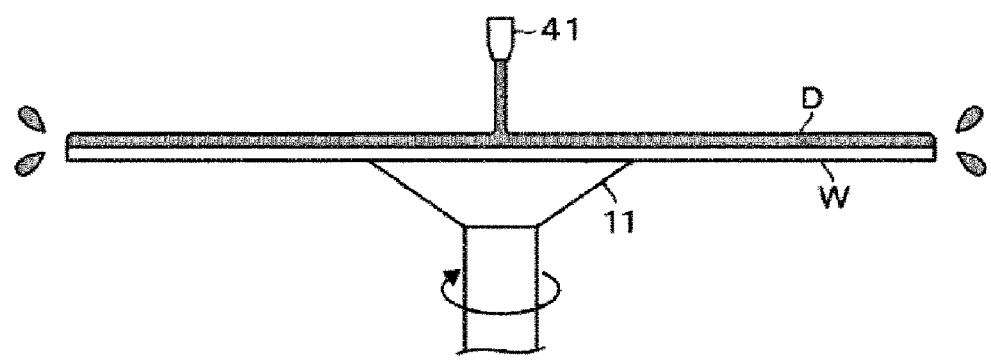
FIG. 3 is a process chart showing a process of an embodiment performed by the developing apparatus of the present disclosure.

Next, the developing process performed by the above-described developing apparatus 1 will be described with reference to FIGS. 3 to 10. In these figures, the movement direction of the developer nozzle 31 is indicated by a dashed dot line arrow, and the flow of the developer is indicated by a solid line arrow. First, the wafer W loaded to the developing apparatus 1 by a substrate transfer mechanism (not shown) is mounted on the spin chuck 11. The central portion of the back surface of the wafer W is adsorbed onto the spin chuck 11 so that the wafer W is horizontally held. Then, a relatively small amount of the developer D is supplied to the central portion of the wafer W from the developer nozzle 41 which moves from the standby part 48 to above the central portion of the wafer W and at the same time, the wafer W rotates. The developer D spreads over a peripheral portion of the wafer W by virtue of a centrifugal force caused by the rotation of the wafer W and is coated onto the entire surface of the wafer W. Thus, the wafer W is subjected to the pre-wetting process (FIG. 3).

Subsequently, the developer nozzle 41 returns to the standby part 48. The developer nozzle 31 moves from the standby part 30 toward the peripheral portion of the wafer W so that the lower surface 32 of the developer nozzle 31 is arranged so as to come close to the surface of the wafer W. Specifically, for example, the developer nozzle 31 is arranged such that the lower surface 32 is spaced apart from the surface of the peripheral portion of the wafer W by 0.5 mm to 2.0 mm. In this manner, the developer nozzle 31 is arranged. Further, the number of rotations of the wafer W is lower than that available when being subjected to the pre-wetting process. For example, the wafer W continues to be rotated at 50 rpm.

Figure 5:
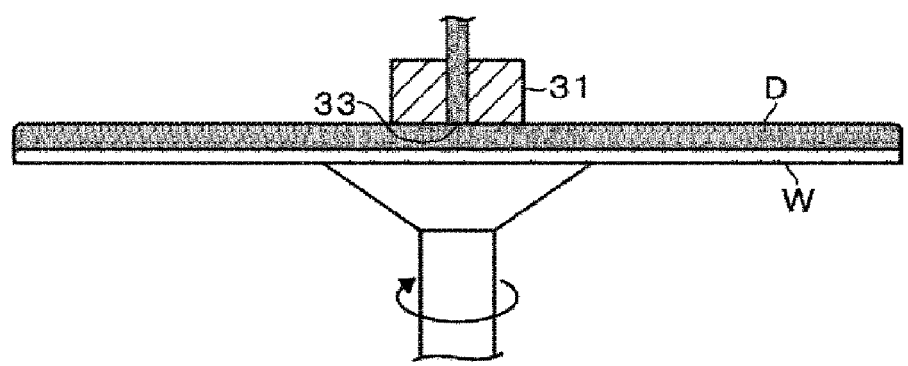
FIG. 5 is a process chart showing a process of the embodiment performed by the developing apparatus of the present disclosure.

Subsequently, the developer D is discharged from the developer nozzle 31 to form a liquid collection portion, and the lower surface 32 of the developer nozzle 31 is brought into contact with the liquid collection portion (FIG. 4). Then, the developer nozzle 31 horizontally moves along the surface of the wafer W toward the central portion of the rotating wafer W in the state where the discharge of the developer D is continued. The liquid collection portion is spread over the surface of the wafer W in the state where the lower surface 32 of the developer nozzle 31 is brought into contact with the liquid collection portion of the developer D. Thus, the developer is stirred below the developer nozzle 31 as described above. When the discharge port 33 of the developer nozzle 31 is positioned above the central portion of the wafer W and the entire surface of the wafer W is covered with the liquid collection portion of the developer D, the movement of the developer nozzle 31 and the discharge of the developer D from the discharge port 33 are stopped (FIG. 5). Meanwhile, the resist film is developed by the formed liquid collection portion on the entire surface of the wafer W, so that the resolution of the corresponding pattern proceeds.

Figure 6:
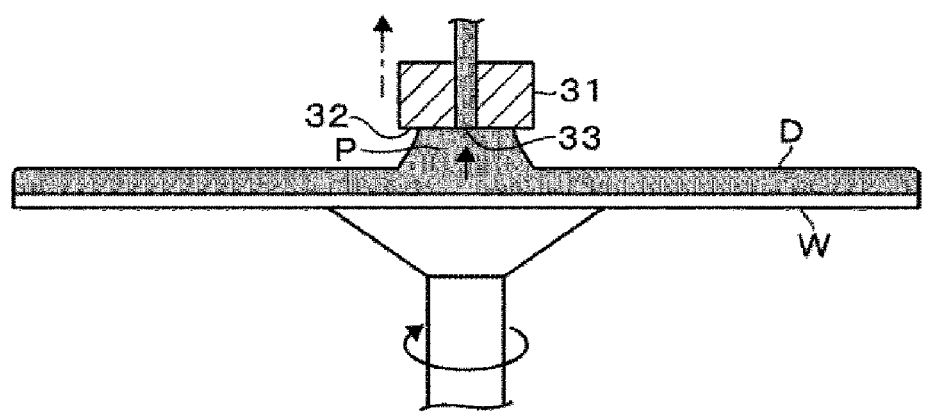
FIG. 6 is a process chart showing a process of the embodiment performed by the developing apparatus of the present disclosure.
Figure 7:
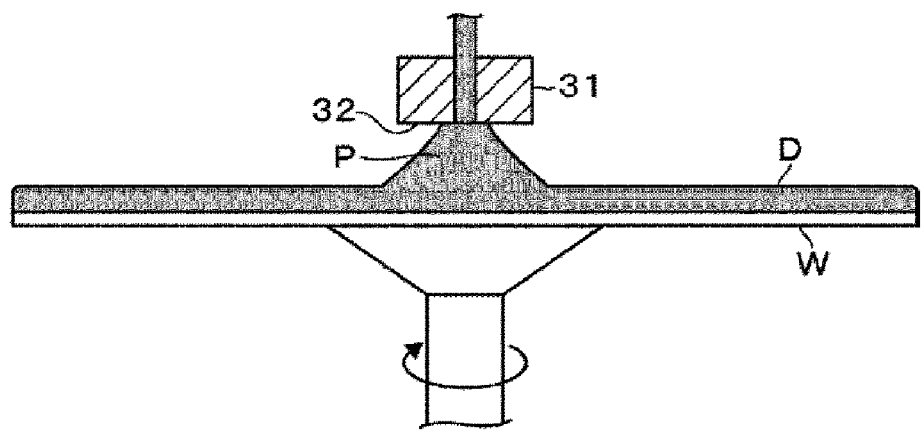
FIG. 7 is a process chart showing a process of the embodiment performed by the developing apparatus of the present disclosure.

Subsequently, the developer nozzle 31 is lifted to be spaced apart from the wafer W. Since the developer exists in the discharge port 33 of the developer nozzle 31, the developer constituting a portion of the liquid collection portion in the vicinity of the discharge port 33 is pulled up with the lifting of the developer nozzle 31 by the action of the surface tension of the developer inside the discharge port 33. Thus, a liquid pillar P of which an upper end is in contact with the lower surface 32 and the center overlaps the discharge port 33 as viewed in a plan view is formed (FIG. 6). When the developer nozzle 31 continues to be lifted and when the liquid pillar P is extended and is increased in height, the lower surface 32 of the developer nozzle 31 is spaced apart from the surface of the wafer W by a distance of 4.7 mm or less, for example, 4.5 mm. Then, the lifting of the developer nozzle 31 is stopped and a force of extending the liquid pillar P is eliminated, which stabilizes the liquid pillar P. As the liquid pillar P is stabilized in this way, the lower surface 32 and the surface of the wafer W are separated from each other by the above-mentioned distance, so that the liquid pillar P is formed in a conical shape having an upwardly-tapered upper end (FIG. 7).

Figure 8:
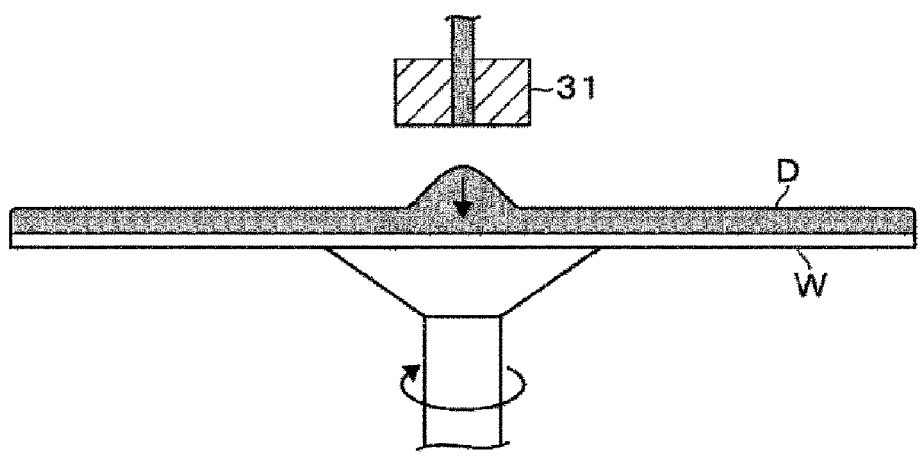
FIG. 8 is a process chart showing a process of the embodiment performed by the developing apparatus of the present disclosure.
Figure 9:
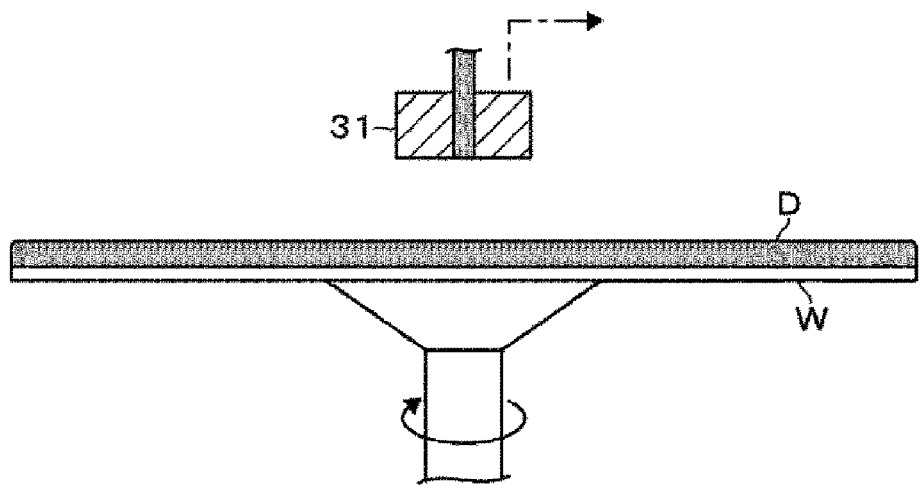
FIG. 9 is a process chart showing a process of the embodiment performed by the developing apparatus of the present disclosure.
Figure 10:
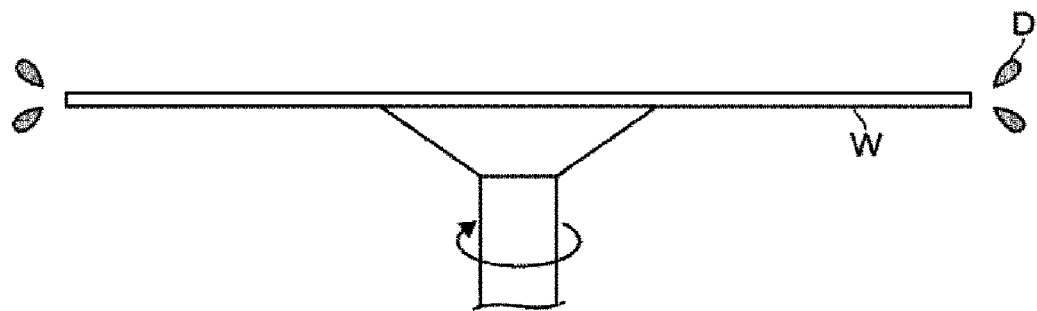
FIG. 10 is a process chart showing a process of the embodiment performed by the developing apparatus of the present disclosure.

A twisting force caused by the rotation of the wafer W acts on the liquid pillar P as a shearing force for shearing the liquid pillar P. As described above, the upper end of the liquid pillar P is weak because it is thinnest. Thus, the upper end is shorn so that the developer nozzle 31 is separated from the liquid pillar P. The developer D constituting the liquid pillar P drops onto the liquid collection portion of the surface of the wafer W due to its own weight (FIG. 8). The upper end of the liquid pillar P is shorn in this manner so that the liquid droplet of the developer D forming the liquid pillar P remains unadhered to the lower surface 32 of the developer nozzle 31. Thereafter, the developer nozzle 31 is further lifted so as to move outward the liquid-receiving cup 13, and then horizontally moves away from the wafer W (FIG. 9). The developer nozzle 31 returns to the inside of the standby part 30. The developer nozzle 31 is retracted in this way, while the number of rotations of the wafer W increases so that the developer D is dropped from the wafer W (FIG. 10). Thereafter, if the rotation of the wafer W is stopped, the wafer W is carried out of the developing apparatus 1 by the substrate transfer mechanism.

Figure 11:
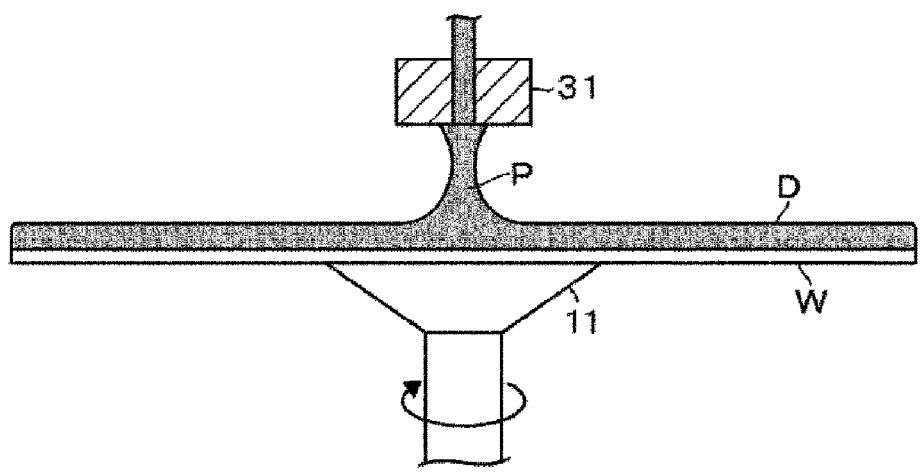
FIG. 11 is a process chart showing a process of a comparative example performed by the developing apparatus of the present disclosure.

The series of processes described above are assumed to be processes of the embodiment of the present disclosure. Processes of Comparative example will be described with reference to FIGS. 11 to 13 in order to clearly manifest the effect of the processes of the present disclosure. In the processes of the embodiment of the present disclosure, a position where the lifting of the developer nozzle 31 is stopped will be referred to as a liquid pillar stabilized position. In the processes of Comparative example, the processes described with reference to FIGS. 3 to 5 are carried out in the same manner as the processes of the embodiment of the present disclosure so that a liquid collection portion of the developer D is formed and the developing process is performed. Subsequently, when the developer nozzle 31 is retracted from the wafer W, the developer nozzle 31 is further lifted without stopping the lifting of the developer nozzle 31 at the liquid pillar stabilized position. If the developer nozzle 31 is not stopped at the liquid pillar stabilized position as described above, the liquid pillar P continuously receives the extending force and is not stabilized. Further, as a distance between the developer nozzle 31 and the wafer W becomes longer, the liquid pillar P becomes a shape having a constricted portion (FIG. 11). That is to say, in the liquid pillar P, a portion lower than the upper end is extremely thin and becomes weak.

Figure 12:
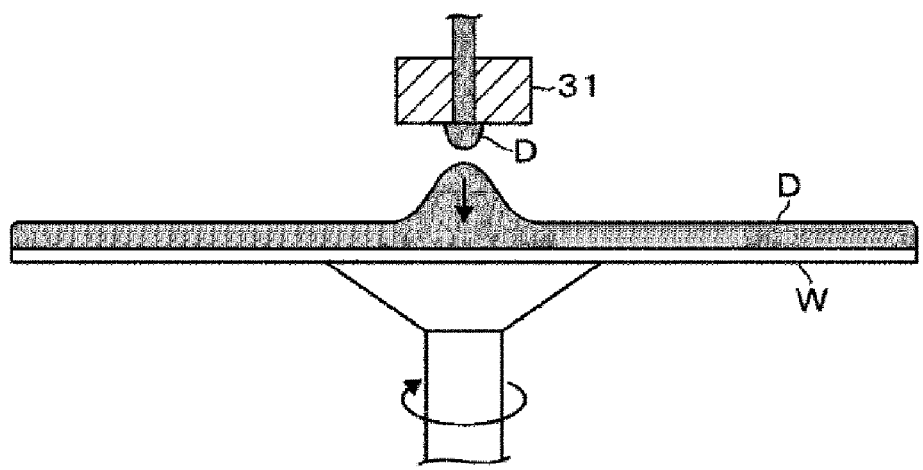
FIG. 12 is a process chart showing a process of the comparative example performed by the developing apparatus of the present disclosure.
Figure 13:
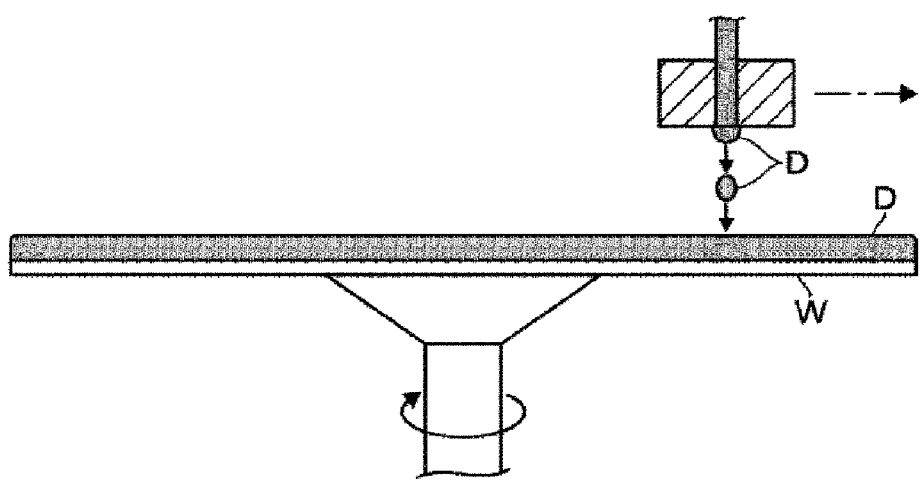
FIG. 13 is a process chart showing a process of the comparative example performed by the developing apparatus of the present disclosure.

With the rotation of the wafer W, the constricted portion of the liquid pillar P is shorn. Thus, the developer D forming the liquid pillar P above the constricted portion becomes a liquid droplet adhering to the developer nozzle 31 (FIG. 12). Subsequently, when the lifting of the developer nozzle 31 is stopped and the developer nozzle 31 moves horizontally to be spaced apart from the wafer W, the developer D adhering to the developer nozzle 31 drops onto the surface of the wafer W by shaking or vibration of the developer nozzle 31. This may cause a variation in a design value of the CD or a defect that the pattern is not resolved (FIG. 13).

As described above, according to the processes of the embodiment of the present disclosure, after the liquid collection portion of the developer is formed over the entire surface of the wafer W, the developer nozzle 31 in which the discharge of the developer is stopped is lifted from the wafer W to form the liquid pillar P by virtue of the surface tension of the developer. Subsequently, by stopping the lifting of the developer nozzle 31 and applying the shearing force caused by the rotation of the wafer W to the liquid pillar P having the upwardly-tapered upper end. As a result, the upper end of the liquid pillar P is shorn, which makes it possible to prevent the liquid droplet of the developer from adhering to the lower surface of the developer nozzle 31. It is therefore possible to prevent the liquid droplet from dropping down the wafer W from the developer nozzle 31. Thus, it is possible to prevent occurrence of an abnormality such as a variation in a design value of the CD or a defect that the pattern is not resolved, which is caused by the drop of the liquid droplet.

In the aforementioned processes of the embodiment of the present disclosure, a period of time from when the developer nozzle 31 starts to be lifted till when it moves to the liquid pillar stabilized position at which the lifting is stopped may be set as short as possible. For example, the period of time may be set to one second or less. The reason for this is as follow. The liquid pillar P is locally formed on the central portion as described above, the amounts of the developer supplied to the central portion of the wafer W and the peripheral portion thereof are different from each other at a time interval in which the liquid pillar P has been formed. Thus, it is necessary to prevent the variation of the CD between the central portion and the peripheral portion of the wafer W due to the difference in the amount of the developer.

Incidentally, the reason for stopping the lifting of the developer nozzle 31 at the liquid pillar stabilized position in the processes of the embodiment of the present disclosure is to shear the upper end of the liquid pillar P by preventing the liquid pillar P from receiving the vertically extending force to stabilize the liquid pillar P and forming the liquid pillar P to have an upwardly-tapered upper end. In some embodiments, the lifting of the developer nozzle 31 may not be completely stopped at the liquid pillar stabilized position as long as the liquid pillar P can be stabilized in such a shape, and the liquid pillar P may be lifted. Alternatively, the developer nozzle 31 may be lifted at a very slow speed at the liquid pillar stabilized position. That is to say, the expression that the lifting of the developer nozzle 31 is stopped means that the lifting of the developer nozzle 31 is stopped visually. Here, even if the developer nozzle 31 is lifted from the liquid pillar stabilized position at a level that is invisible to human eyes, for example, at a speed of 0.01 mm or less per second, the developer nozzle 31 may be regarded as being stopped. Therefore, the stabilization of the liquid pillar P in a shape having the upwardly-tapered upper includes lifting the developer nozzle 31 at a first speed from a height position at which the developer is discharged to form the liquid pillar P, placing the developer nozzle 31 at the liquid pillar stabilized position and subsequently, controlling a lifting speed of the developer nozzle 31 at a second speed lower than the first speed. Here, the second speed includes zero.

In addition, the liquid pillar stabilized position of the developer nozzle 31 is not limited to the above-described height. The liquid pillar stabilized position is not particularly limited as long as the upwardly-tapered upper end of the liquid pillar P can be shorn by the rotation of the wafer W as described above. In addition, the number of rotations of the wafer W when such a shearing is performed is not limited to the above-mentioned 50 rpm. If the number of rotations is too large, the centrifugal force acting on the liquid pillar P becomes too large so that the liquid pillar P may be scattered to each portion of the wafer W, which causes development defects. As such, the number of rotations of the wafer W when the shearing may be set to, for example, 100 rpm or less. In addition, when the liquid pillar P is stabilized in a shape having the upwardly-tapered upper end as described above, it is only necessary to act a shearing force merely on the liquid pillar P. Therefore, the rotation of the wafer W may be stopped in a time interval during which the developer nozzle 31 is lifted and reaches the liquid pillar stabilized position, after the discharge of the developer from the developer nozzle 31 is stopped.

Figure 14:
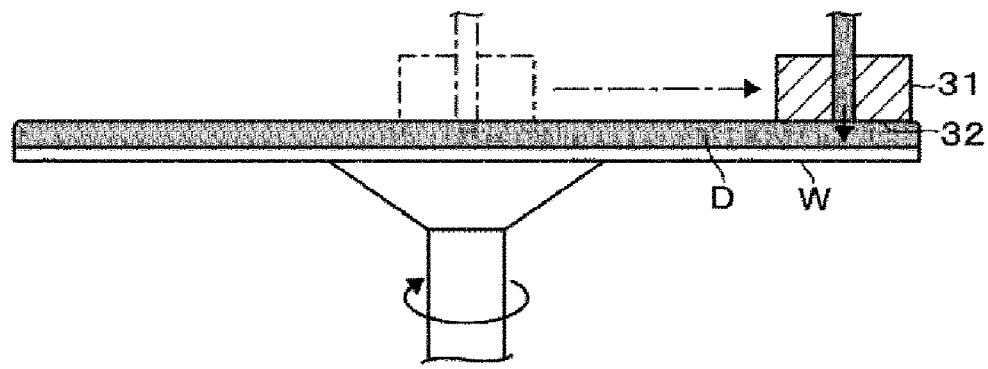
FIG. 14 is a process chart showing a process of another embodiment performed by the developing apparatus of the present disclosure.
Figure 15:
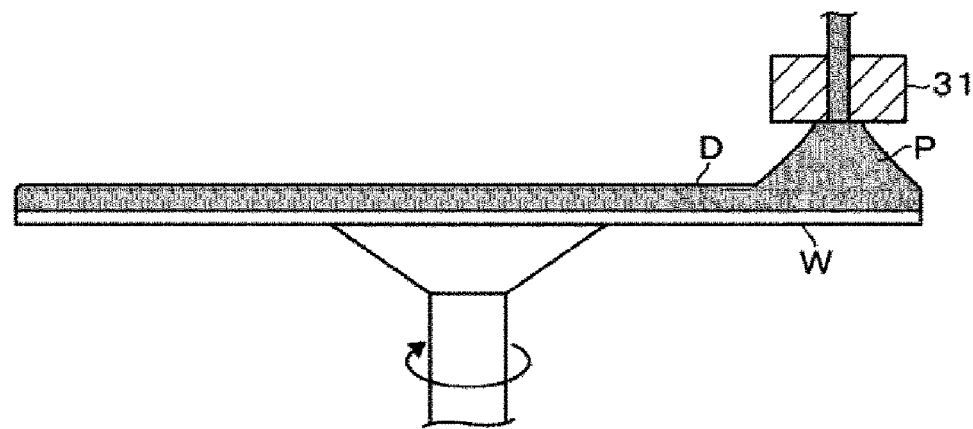
FIG. 15 is a process chart showing a process of another embodiment performed by the developing apparatus of the present disclosure.
Figure 16:
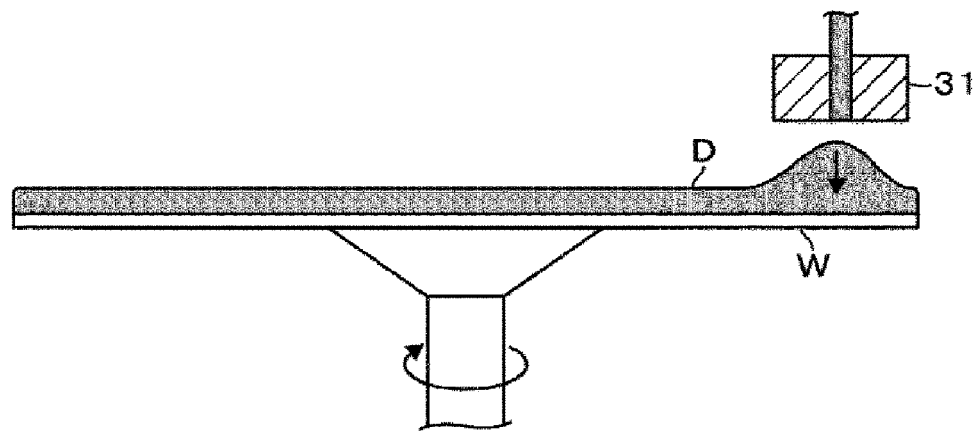
FIG. 16 is a process chart showing a process of another embodiment performed by the developing apparatus of the present disclosure.

The developing apparatus 1 may be configured such that the resist film formed on the wafer W is a positive type and the developer discharged from the developer nozzles 31 and 41 is a developer for developing the positive resist film. The process for developing the positive resist film will be described with a focus on the differences from the process for developing the negative resist film described in FIGS. 3 to 10. As described above, after the pre-wetting process is performed, the lower surface 32 of the developer nozzle 31 is arranged so as to face and be close to the surface of the central portion of the wafer W. Subsequently, the developer D is discharged to form a liquid collection portion. The developer nozzle 31 is moved horizontally along the surface of the wafer W toward the peripheral portion of the wafer W in the state in which the lower surface 32 is brought into contact with the liquid collection portion (FIG. 14). When the developer nozzle 31 is positioned above the peripheral portion of the wafer W so that the entire surface of the wafer W is covered with the liquid collection portion and when the discharge of the developer D from the developer nozzle 31 is stopped, the formation of the liquid pillar P by the lifting of the developer nozzle 31, the stop of the lifting of the developer nozzle 31 at the liquid pillar stabilized position (FIG. 15), and the shearing of the upper end of the liquid pillar P by the rotation of the wafer W (FIG. 16) are sequentially performed.

In other words, in the case of developing the positive resist film, the developer nozzle 31 moves from the central portion of the wafer W toward the peripheral portion of the wafer W and the liquid collection portion spreads over the surface of the wafer W, in the order opposed to that of developing the negative resist film. Thus, a position where the liquid pillar P is formed and shorn is above the peripheral portion of the wafer W. Since the liquid pillar P is formed at the peripheral portion of the wafer W as described above, the number of rotations of the wafer W may be set at a low level of rotation speed such as 100 rpm or less, specifically 10 rpm to 60 rpm during the lifting of the developer nozzle 31 so that the liquid pillar P is not shorn during the lifting of the developer nozzle 31. The reason why the developer nozzle 31 is moved from the central portion to the peripheral portion of the wafer W will be explained. In the case of developing the positive resist film, a period of resolution time from when the developer is supplied to the positive resist film till when unnecessary portions of the positive resist film are dissolved to resolve a pattern is long, as compared to the case of developing the negative resist film. Therefore, at the time of completing the pre-wetting process, the resolution of the pattern further proceeds in the central portion of the wafer W rather than the peripheral portion thereof. Accordingly, by moving the developer nozzle 31 from the central portion of the wafer W to the peripheral portion of the wafer W and spreading the liquid collection portion of the developer, the resolution of the pattern until the liquid collection portion is formed is made uniform throughout the central portion and the peripheral portion of the wafer W. This makes the CD uniform throughout the central portion and the peripheral portion of the wafer W.

In the case of developing the negative resist film, the pattern is resolved at the same level throughout the central portion and the peripheral portion of the wafer W by the pre-wetting process in the formation of the liquid collection portion of the developer. Therefore, as in the case of developing the positive resist film, the developer nozzle 31 may be moved from the central portion of the wafer W toward the peripheral portion thereof to spread the liquid collection portion. However, by starting the formation of the liquid collection portion on the peripheral portion of the wafer W, it is possible to disposing the developer nozzle 31 above the wafer W without interfering with the developer nozzle 31 disposed above the central portion of the wafer W to perform the pre-wetting process. In other words, it is possible to start the formation of the liquid collection portion quickly after the pre-wetting process, thus improving throughput. Accordingly, in the processes described in FIGS. 3 to 10, the formation of the liquid collection portion is started on the peripheral portion of the wafer W. As described above, in the case where the liquid collection portion starts to be formed on the peripheral portion of the wafer W and spreads toward the central portion of the wafer W, the developer nozzle 31 moves along the wafer W to be retracted from the wafer W. Thus, the developer is prevented from adhering to the developer nozzle 31 by shearing the upper end of the liquid pillar P, thus preventing the developer from dropping downward. Accordingly, the aforementioned method is particularly effective.

Figure 17:
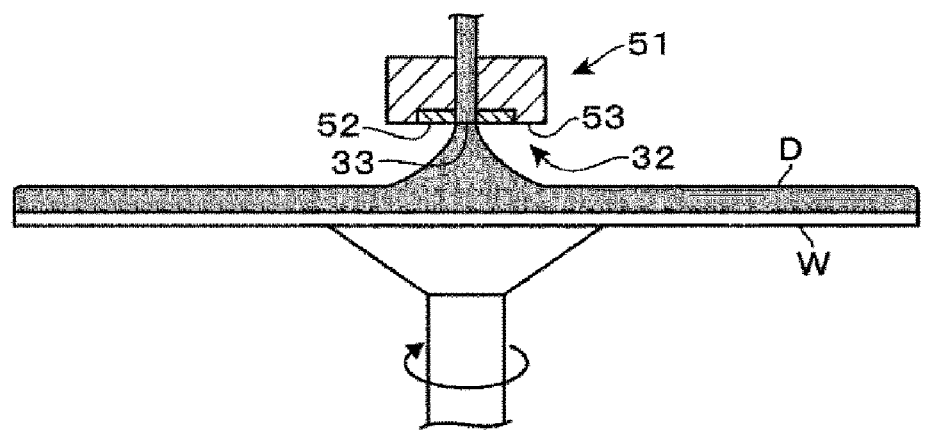
FIG. 17 is a longitudinal sectional side view showing another configuration of a developer nozzle of the developing apparatus.
Figure 18:
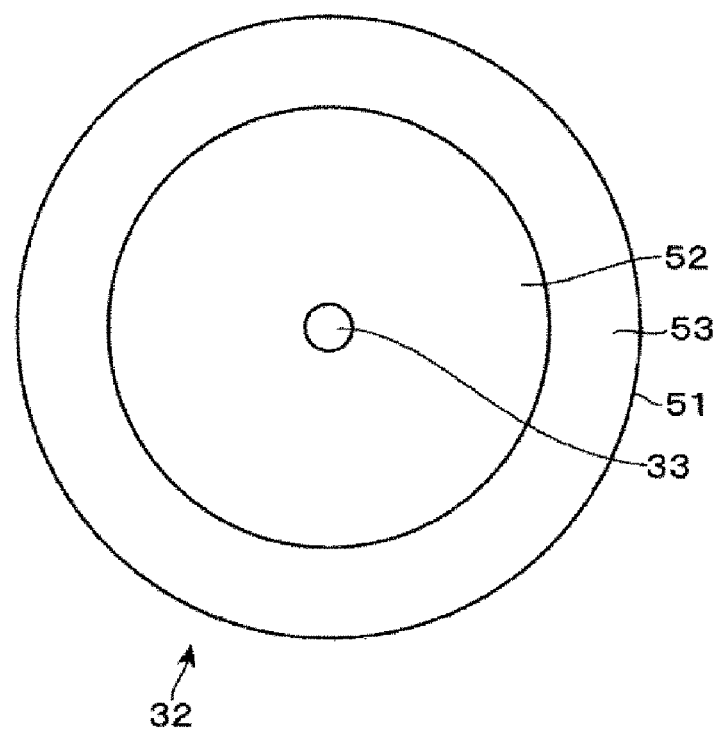
FIG. 18 is a bottom view of the developer nozzle.

Next, another configuration example of the developer nozzle will be described. FIGS. 17 and 18 show a longitudinal sectional side view and a bottom view of a developer nozzle 51 used for development of a negative resist film, respectively. The developer nozzle 51 is used in place of the developer nozzle 31 in the developing apparatus 1. The developer nozzle 51 is different from the developer nozzle 31 in that a first annular region 52 and a second annular region 53 having different hydrophilicities are formed on the lower surface 32. The first annular region 52 is formed in an annular shape in the central portion of the lower surface 32 so as to surround the discharge port 33 while being adjacent to the discharge port 33. The second annular region 53 is formed in an annular shape in the peripheral portion of the lower surface 32 so as to surround the first annular region 52. The first annular region 52 has higher hydrophilicity than the second annular region 53. Since the developer for developing the negative resist film contains a thinner, the developer is hardly impregnated into a region having high hydrophilicity. That is to say, the first annular region 52 is configured to have a larger contact angle with respect to the developer than the second annular region.

Even in the case of using the developer nozzle 51, the processes of the embodiment of the present disclosure described in FIGS. 3 to 10 is performed. During the processes, when the liquid collection portion of the developer spreads over the surface of the wafer W, since the contact angle of the second annular region 53 with respect to the developer is small, namely since the adsorptivity of the second annular region 53 with respect to the developer is high, the developer is sufficiently stirred. When the liquid pillar P of the developer is formed and shorn, since the contact angle of the first annular region 52 formed around the discharge port 33 with respect to the developer is large, namely since the developer hardly adheres to the first annular region 52, it is possible to more reliably prevent the developer contributed to form the liquid pillar P from remaining in the vicinity of the discharge port 33 of the lower surface 32 and adhering as the liquid droplet after the shearing of the liquid pillar P. The first annular region 52 may be formed to have higher surface roughness than that of the second annular region 53. Specifically, the first annular region 52 may be formed to have minute unevenness formed thereon by being subjected a plasma treatment, a blast treatment, or the like. In some embodiments, the first annular region 52 and the second annular region 53 may be made of different materials.

Figure 19:
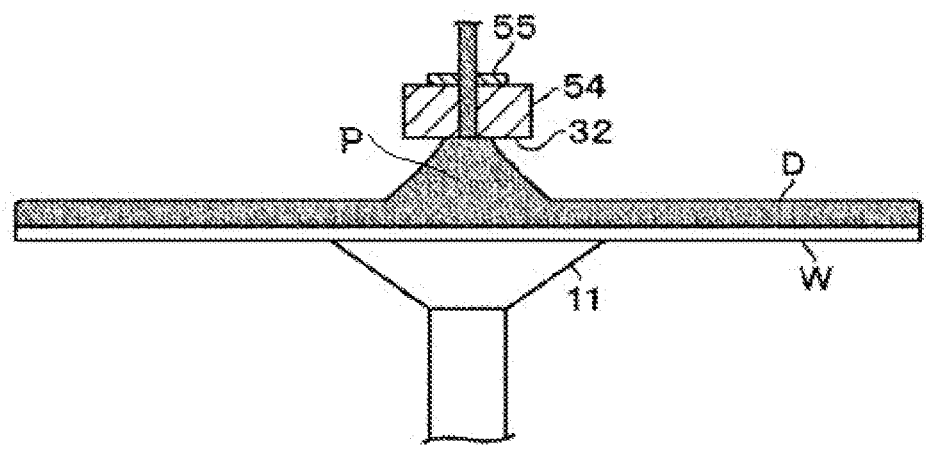
FIG. 19 is a longitudinal sectional side view showing another configuration of the developing nozzle.

The shearing of the liquid pillar P is not limited to rotating the wafer W as described above. FIG. 19 shows a developer nozzle 54 configured to shear the upper end of the liquid pillar P without rotating the wafer W. A difference between the developer nozzle 31 and the developer nozzle 54 is that a vibrator 55 including, for example, a piezo element, is provided on the developer nozzle 54 and the developer nozzle 54 vibrates by the vibrator 55.

Figure 20:
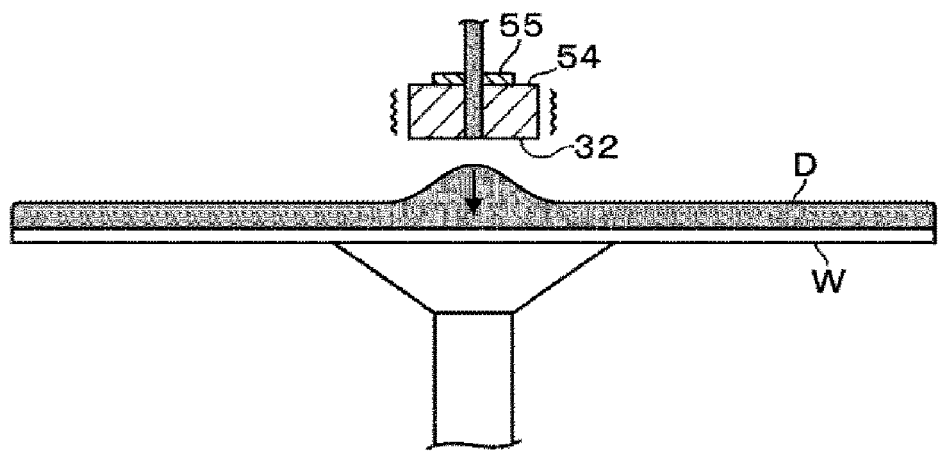
FIG. 20 is a longitudinal sectional side view of the developer nozzle.

Even in the case of using the developer nozzle 54, processes substantially identical to those of the above-described embodiment of the present disclosure are performed. However, a difference resides in that the rotation of the wafer W is stopped during a period of time from the lifting of the developer nozzle 54 toward the liquid pillar stabilized position to the shearing of the liquid pillar P. In addition, the vibration of the developer nozzle 54 by the vibrator 55 does not occur during the lifting of the developer nozzle 54. In addition, FIG. 19 shows a state in which the lifting of the developer nozzle 54 is stopped at the liquid pillar stabilized position. The stopping of the lifting of the developer nozzle 54 stabilizes the liquid pillar P as described above. When the upper end of the liquid pillar P is tapered as it goes upward, the developer nozzle 54 vibrates by the vibrator 55. A shearing force is applied to the liquid pillar P due to such a vibration so that the upper end of the liquid pillar P is shorn. Thus, as shown in FIG. 20, the liquid pillar P is separated from the developer nozzle 54. The installation position of the vibrator 55 is not limited to the above-described position. For example, the vibrator 55 may be embedded in a cylinder constituting the developer nozzle 54.

Figure 21:
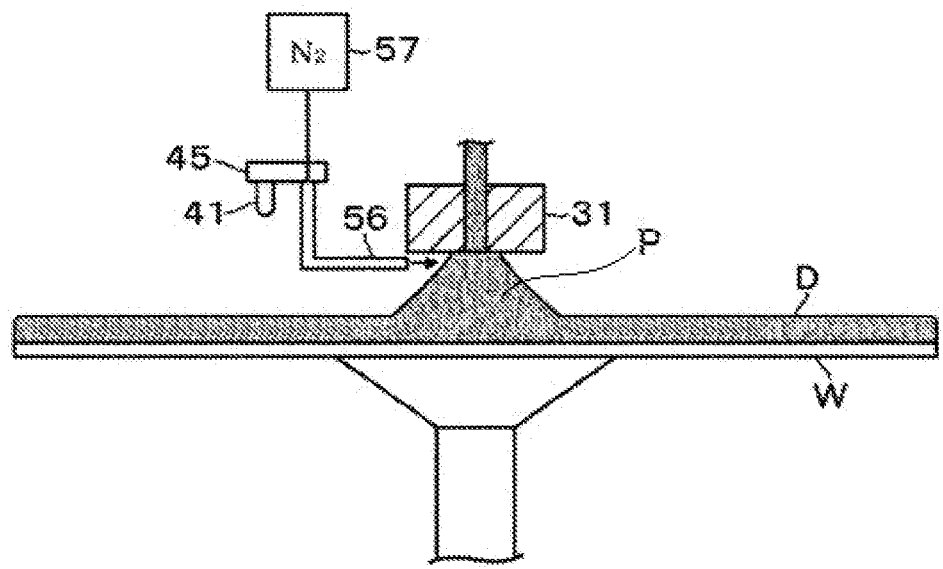
FIG. 21 is a front view of an arm provided in the developing apparatus.

FIG. 21 is a front view of the arm 45 supporting the developer nozzle 41 used for the pre-wetting process. In FIG. 21, as in the case of using the developer nozzle 54 described above, a gas discharge nozzle 56 is provided in the arm 45 to shear the liquid pillar P without the rotation of the wafer W. The gas discharge nozzle 56 is configured to discharge an $N_2$ (nitrogen) gas supplied from a supply source 57 of the $N_2$ gas in a lateral direction. When the lifting of the developer nozzle 31 is stopped at the liquid pillar stabilized position, the liquid pillar P is stabilized as described above. When the upper end of the liquid pillar P is tapered as it goes upward, the N2 gas is discharged so as to collide with the upper end of the liquid pillar P. This collision acts as a shearing force to shear the upper end of the liquid pillar P. Thus, the liquid pillar P is separated from the developer nozzle 31.

Figure 22:
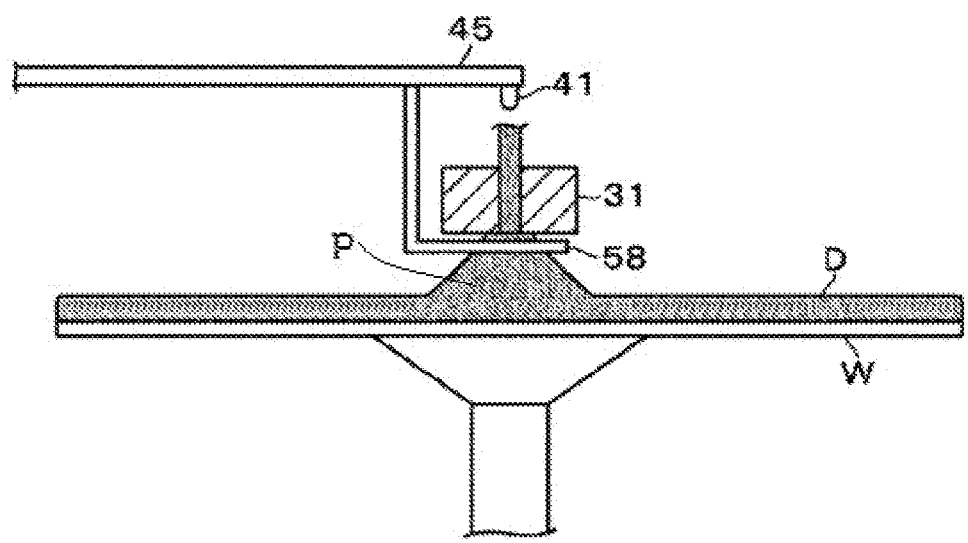
FIG. 22 is a side view of a liquid removal rod provided in the developing apparatus.
Figure 23:
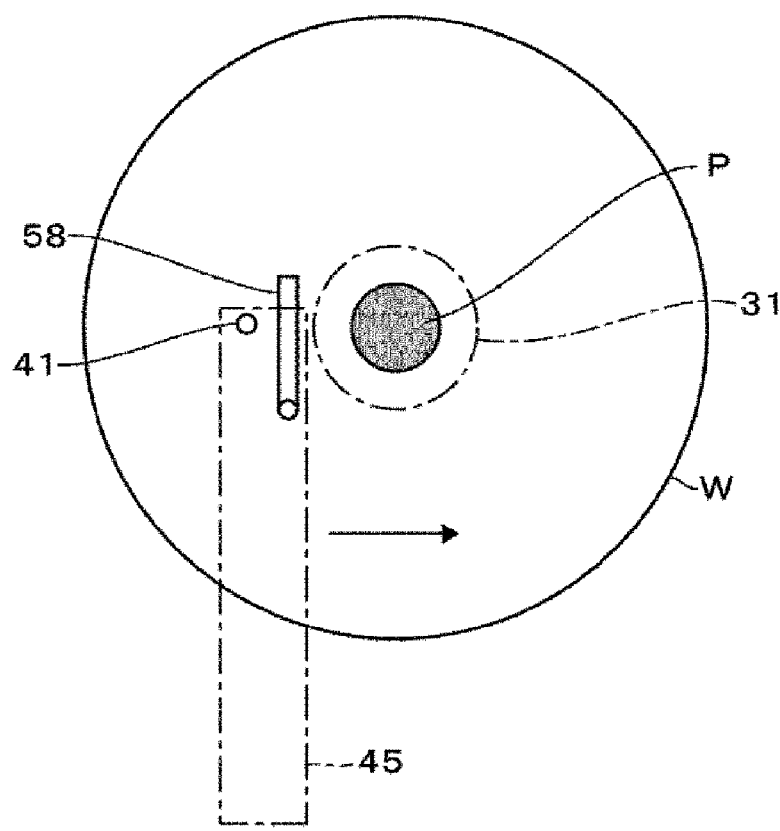
FIG. 23 is a plan view showing the liquid removal rod.

FIGS. 22 and 23 show a side view and a top view of a liquid removal rod 58 provided in the arm 45, respectively. A tip of the liquid removal rod 58 is provided to extend in the lateral direction. The liquid removal rod 58 is also provided to shear the liquid pillar P without rotating the wafer W. When the lifting of the developer nozzle 31 is stopped at the liquid pillar stabilized position, the liquid pillar P is stabilized as described above. When the upper end of the liquid pillar P is tapered as it goes upward, a height of the tip of the liquid removal rod 58 becomes equal to the height of the upper end of the liquid pillar P with the upward-downward movement of the arm 45. As shown in FIG. 23, the arm 45 is horizontally moved to transverse through the liquid removal rod 58 from one side to the other side. In other words, the liquid removal rod 58 staying in a solid state collides against the liquid pillar P. The upper end of the liquid pillar P is shorn by such a collision. In FIG. 22, for the sake of convenience in illustration, the tip of the liquid removal rod 58 is shown to be positioned slightly lower than the upper end of the liquid pillar P.

Figure 24:
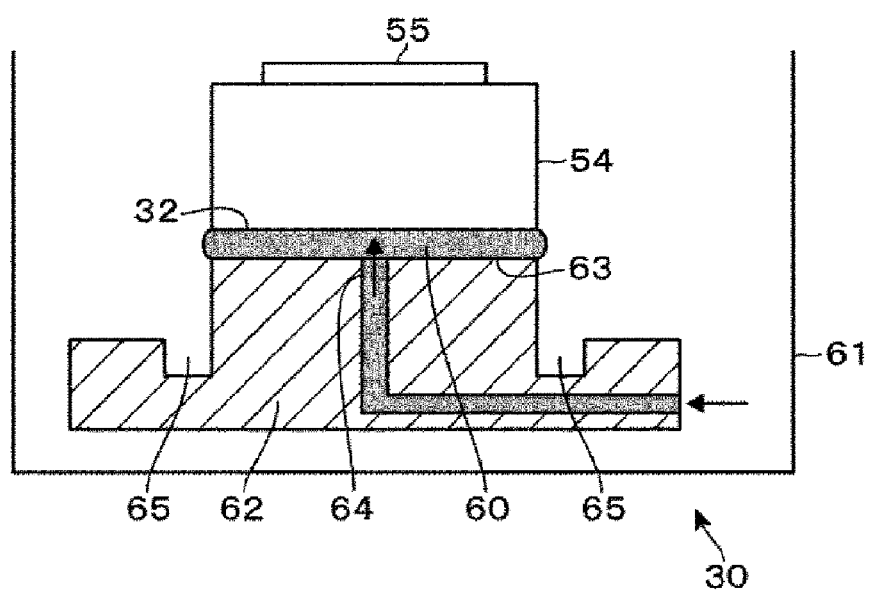
FIG. 24 is a longitudinal sectional side view of a standby part provided in the developing apparatus.

Next, an example of the configuration of the standby part 30 will be described with reference to FIG. 24. The developer nozzle 54 described in each of FIGS. 19 and 20 is shown as a developer nozzle accommodated in the standby part 30. In FIG. 24, reference numeral 61 denotes a cup having an opened upper portion. The cup 61 constitutes the standby part 30 and stores the developer nozzle 31 therein. In FIG. 24, reference numeral 62 denotes a cleaning member for cleaning the lower surface 32 of the developer nozzle 31 provided inside the cup 61. The cleaning member 62 includes a horizontal opposing surface 63 facing the lower surface 32 of the developer nozzle 54, and a discharge port 64 of a cleaning liquid 60, which is opened in the opposing surface 63. In a state in which the lower surface 32 of the developer nozzle 54 is close to and faces the opposing surface 63, the cleaning liquid 60 is supplied from the discharge port 64 between the opposing surface 63 and the lower surface 32 of the developer nozzle 54 to form a liquid collection portion. Thus, the lower surface 32 is cleaned. In FIG. 24, reference numeral 65 denotes a groove formed in the vicinity of the opposing surface 63. The cleaning liquid 60 overflowing and dropping from the opposing surface 63 is introduced into the groove 65 and is discharged through a waste liquid path (not shown) connected to the groove 65.

In the standby part 30 configured as above, after the lower surface 32 of the developer nozzle 54 is cleaned as described above, operations substantially similar to those described in FIGS. 19 and 20 are performed so as to prevent the cleaning liquid 60 from being moved onto the wafer W while adhering to the lower surface 32 of the developer nozzle 54. This prevents a liquid droplet of the cleaning liquid 60 from adhering to the developer nozzle 54. First, the discharge of the cleaning liquid 60 from the discharge port 64 of the cleaning member 62 is stopped and the cleaning of the lower surface 32 of the developer nozzle 54 is completed. The liquid collection portion of the cleaning liquid 60 remains between the lower surface 32 and the opposing surface 63 of the cleaning member 62. Subsequently, the developer nozzle 54 is lifted, the cleaning liquid 60 which is in contact with the lower surface 32 is lifted due to an interfacial tension (adsorption force) of the lower surface 32 of the developer nozzle 54 with respect to the cleaning liquid 60. The cleaning liquid 60 separated from the lower surface 32 is also lifted due to the surface tension of the cleaning liquid. As a result, a liquid pillar P1 of the cleaning liquid 60 that extends from the opposing surface 63 of the cleaning member 62 toward the lower surface 32 of the developer nozzle 54 is formed. In addition, the vibration of the developer nozzle 54 by the vibrator 55 does not occur during the lifting of the developer nozzle 54.

Figure 25:
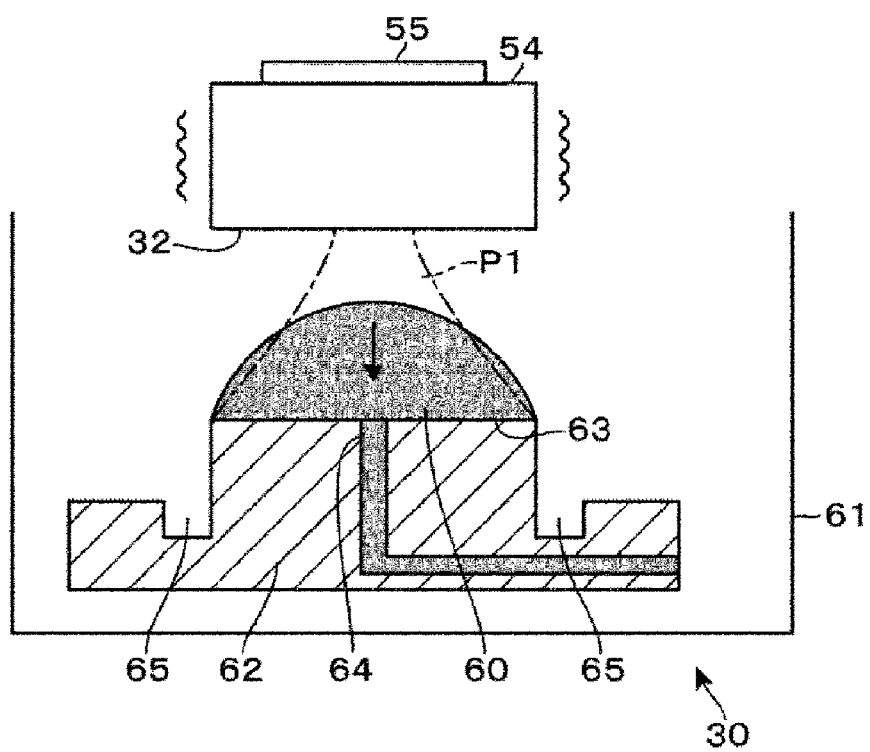
FIG. 25 is a longitudinal sectional side view of the standby part.

Subsequently, the lifting of the developer nozzle 54 is stopped at a height at which the lower surface 32 of the developer nozzle 54 is spaced apart from the opposing surface 63 of the cleaning member 62 by a predetermined distance. An upper end of the liquid pillar P1 is tapered as it goes upward and the liquid pillar P1 remains stabilized. That is to say, the lifting of the developer nozzle 54 is stopped at a height position corresponding to the liquid pillar stabilized position. A one-dot chain line in FIG. 25 shows the liquid pillar P1 that remains stabilized in this manner. Thereafter, the developer nozzle 54 vibrates by the vibrator 55 to apply a shearing force with respect to the liquid pillar P1. As a result, the upper end of the liquid pillar P1 is shorn. As shown in FIG. 25, the cleaning liquid 60 contributed to form the liquid pillar P1 is separated from the developer nozzle 54. Accordingly, it is possible to prevent the liquid droplet of the cleaning liquid 60 from adhering to the lower surface 32 of the developer nozzle 54. Subsequently, the developer nozzle 54 is transferred above the wafer W. As described above, the liquid collection portion is formed so that the wafer W is subjected to the developing process. Since no cleaning liquid 60 have been adhered to the lower surface 32, it is possible to prevent the occurrence of abnormality of the developing process due to the drop of the cleaning liquid 60 onto the wafer W.

Furthermore, in performing the processes of the embodiment of the present disclosure, the liquid pillar P of the developer has been described to be formed by lifting the developer nozzle 31 with respect to the wafer W. However, the spin chuck 11 may be configured to be movable upward and downward by an elevating mechanism, whereby the wafer W may be lowered relative to the developer nozzle 31 to form the liquid pillar P. In addition, the developer nozzle 31 may be configured to be rotatable. The liquid pillar P may be shorn by rotating the developer nozzle 31 instead of rotating the wafer W. In addition, each configuration for shearing the liquid pillar P of the developer D may be applied in shearing the liquid pillar P1 of the cleaning liquid 60 in the standby part 30. In other words, in order to shear the tip of the liquid pillar P1, the gas discharge nozzle 56 may be provided in the standby part 30, the liquid removal rod 58 may be connected to a movement mechanism to be movable, or a rotation mechanism for rotating the opposing surface 63 of the cleaning member 62 may be provided.

However, the lower surface 32 of the developer nozzle 31 is not limited to being a flat surface but may be formed to have unevenness as described above. The lower surface 32 is not limited to being parallel to the surface of the wafer W but may be inclined with respect to the surface of the wafer W. Further, the developer discharge port 33 is not limited to being opened at the central portion of the lower surface 32, but may be opened at the peripheral portion of the lower surface 32. In addition, the present disclosure is not limited to the above-described embodiments, but may be appropriately changed or combined.

According to the present disclosure in some embodiments, a liquid collection portion of a developer spreads over a surface of a substrate which is horizontally held, and subsequently, a developer nozzle which is in contact with the liquid collection portion is lifted relative to the surface of the substrate. A pillar of the developer is formed due to a surface tension of the developer. The lifting of the developer nozzle is stopped. In a state in which an upper end of the pillar of the developer is tapered as it goes upward, a shearing force is applied to the upper end of the pillar to shear the upper end. It is therefore possible to prevent the developer contributed to form the liquid collection portion from adhering to the developer nozzle, thus preventing the occurrence of abnormality caused by the dropping of the developer onto the surface of the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A developing method comprising:
horizontally holding a substrate for manufacturing a semiconductor device, wherein the substrate has a resist film formed on a surface thereof which has been exposed;
disposing an opposing surface of a developer nozzle that faces a portion of the surface of the substrate, above one of a central portion and a peripheral portion of the surface of the substrate;
discharging a developer from a discharge port formed to be opened downward from the opposing surface to form a liquid collection portion of the developer to be in contact with the opposing surface;
spreading the liquid collection portion by moving the developer nozzle along the surface of the substrate under rotation toward the other of the central portion and the peripheral portion of the substrate with the opposing surface brought into contact with the liquid collection portion;

lifting the developer nozzle relative to the surface of the substrate in a state in which the discharge of the developer from the discharge port is stopped, and pulling up a portion of the liquid collection portion below the discharge port by a surface tension of the developer;

stopping the lifting the developer nozzle, and forming a pillar of the developer, which has an upwardly-tapered upper end, wherein the upwardly-tapered upper end is brought into contact with the opposing surface by the pulled-up portion of the liquid collection portion; and applying a shearing force to the pillar of the developer to shear the upwardly-tapered upper end of the pillar of the developer and separating the pillar of the developer from the opposing surface.

2. The developing method of claim 1, wherein the applying a shearing force includes applying the shearing force to the pillar of the developer by rotating the substrate.

3. The developer method of claim 2, further comprising: forming a first annular region surrounding the discharge port and a second annular region surrounding the first annular region in the opposing surface, wherein the first annular region and the second annular region have different contact angles with respect to the developer, and the contact angle of the first annular region is larger than the contact angle of the second annular region.

4. The developing method of claim 2, further comprising:
supplying a cleaning liquid between the opposing surface and a cleaning member for cleaning the opposing surface and forming a cleaning liquid collection portion to clean the opposing surface in a state in which the opposing surface of the developer nozzle faces the cleaning member;

lifting the developer nozzle relative to the cleaning member in a state in which the supplying a cleaning liquid is stopped, and pulling up a portion of the cleaning liquid collection portion below the discharge port by a surface tension of the cleaning liquid;

stopping the lifting the developer nozzle, and forming a pillar of the cleaning liquid, which has an upwardly-tapered upper end, wherein the upwardly-tapered upper end is brought into contact with the opposing surface by the pulled-up portion of the cleaning liquid collection portion; and applying a shearing force to the pillar of the cleaning liquid to shear the upwardly-tapered upper end of the pillar of the cleaning liquid and separating the pillar of the cleaning liquid from the opposing surface.

5. The developing method of claim 1, wherein applying a shearing force includes applying the shearing force to the pillar of the developer by causing a gas or a solid to collide with the pillar of the developer.

6. The developing method of claim 5, further comprising: forming a first annular region surrounding the discharge port and a second annular region surrounding the first annular region in the opposing surface, wherein the first annular region and the second annular region have different contact angles with respect to the developer, and the contact angle of the first annular region is larger than the contact angle of the second annular region.

7. The developing method of claim 5, further comprising:
supplying a cleaning liquid between the opposing surface and a cleaning member for cleaning the opposing surface and forming a cleaning liquid collection portion to clean the opposing surface in a state in which the opposing surface of the developer nozzle faces the cleaning member;

lifting the developer nozzle relative to the cleaning member in a state in which the supplying a cleaning liquid is stopped, and pulling up a portion of the cleaning liquid collection portion below the discharge port by a surface tension of the cleaning liquid;

stopping the lifting the developer nozzle, and forming a pillar of the cleaning liquid, which has an upwardly-tapered upper end, wherein the upwardly-tapered upper end is brought into contact with the opposing surface by the pulled-up portion of the cleaning liquid collection portion; and applying a shearing force to the pillar of the cleaning liquid to shear the upwardly-tapered upper end of the pillar of the cleaning liquid and separating the pillar of the cleaning liquid from the opposing surface.

8. The developing method of claim 1, wherein the applying a shearing force includes applying the shearing force to the pillar of the developer by vibrating the developer nozzle.

9. The developing method of claim 8, further comprising: forming a first annular region surrounding the discharge port and a second annular region surrounding the first annular region in the opposing surface, wherein the first annular region and the second annular region have different contact angles with respect to the developer, and the contact angle of the first annular region is larger than the contact angle of the second annular region.

10. The developing method of claim 8, further comprising:
supplying a cleaning liquid between the opposing surface and a cleaning member for cleaning the opposing surface and forming a cleaning liquid collection portion to clean the opposing surface in a state in which the opposing surface of the developer nozzle faces the cleaning member;

lifting the developer nozzle relative to the cleaning member in a state in which the supplying a cleaning liquid is stopped, and pulling up a portion of the cleaning liquid collection portion below the discharge port by a surface tension of the cleaning liquid;

stopping the lifting the developer nozzle, and forming a pillar of the cleaning liquid, which has an upwardly-tapered upper end, wherein the upwardly-tapered upper end is brought into contact with the opposing surface by the pulled-up portion of the cleaning liquid collection portion; and applying a shearing force to the pillar of the cleaning liquid to shear the upwardly-tapered upper end of the pillar of the cleaning liquid and separating the pillar of the cleaning liquid from the opposing surface.

11. The developing method of claim 1, further comprising: forming a first annular region surrounding the discharge port and a second annular region surrounding the first annular region in the opposing surface, wherein the first annular region and the second annular region have different contact angles with respect to the developer, and the contact angle of the first annular region is larger than the contact angle of the second annular region.

12. The developing method of claim 11, further comprising:
supplying a cleaning liquid between the opposing surface and a cleaning member for cleaning the opposing surface and forming a cleaning liquid collection portion to clean the opposing surface in a state in which the opposing surface of the developer nozzle faces the cleaning member;

lifting the developer nozzle relative to the cleaning member in a state in which the supplying a cleaning liquid is stopped, and pulling up a portion of the cleaning liquid collection portion below the discharge port by a surface tension of the cleaning liquid;

stopping the lifting the developer nozzle, and forming a pillar of the cleaning liquid, which has an upwardly-tapered upper end, wherein the upwardly-tapered upper end is brought into contact with the opposing surface by the pulled-up portion of the cleaning liquid collection portion; and applying a shearing force to the pillar of the cleaning liquid to shear the upwardly-tapered upper end of the pillar of the cleaning liquid and separating the pillar of the cleaning liquid from the opposing surface.

13. The developing method of claim 1, further comprising:

supplying a cleaning liquid between the opposing surface and a cleaning member for cleaning the opposing surface and forming a cleaning liquid collection portion to clean the opposing surface in a state in which the opposing surface of the developer nozzle faces the cleaning member;

lifting the developer nozzle relative to the cleaning member in a state in which the supplying a cleaning liquid is stopped, and pulling up a portion of the cleaning liquid collection portion below the discharge port by a surface tension of the cleaning liquid;

stopping the lifting the developer nozzle, and forming a pillar of the cleaning liquid, which has an upwardly-tapered upper end, wherein the upwardly-tapered upper end is brought into contact with the opposing surface by the pulled-up portion of the cleaning liquid collection portion; and applying a shearing force to the pillar of the cleaning liquid to shear the upwardly-tapered upper end of the pillar of the cleaning liquid and separating the pillar of the cleaning liquid from the opposing surface.

14. A non-transitory computer-readable storage medium that stores a computer program used in a developing apparatus which develops a substrate for manufacturing a semiconductor device, wherein the substrate has a resist film formed on a surface thereof and has been exposed, wherein the computer program is organized with a group of steps for performing the developing method of claim 1.

15. A developing apparatus comprising:

a substrate holding part configured to horizontally hold a substrate for manufacturing a semiconductor device, wherein the substrate has a resist film formed on a surface thereof which has been exposed;

a rotating mechanism configured to rotate the substrate held by the substrate holding part;

a developer nozzle having an opposing surface formed to face a portion of the surface of the substrate, and a discharge port of a developer, which is formed to be opened downward to face the opposing surface;

a movement mechanism configured to move the development nozzle along the surface of the substrate;

a relative elevating mechanism configured to elevate the developer nozzle relative to the substrate; and a controller configured to output a control signal to execute operations of:

disposing the opposing surface above one of a central portion and a peripheral portion of the surface of the substrate held by the substrate holding part;

discharging the developer from a discharge port opened in the opposing surface to form a liquid collection portion of the developer to be in contact with the opposing surface;

spreading the liquid collection portion by moving the developer nozzle along the surface of the substrate under rotation toward the other of the central portion and the peripheral portion of the substrate with the opposing surface brought into contact with the liquid collection portion;

lifting the developer nozzle relative to the surface of the substrate in a state in which the discharge of the developer from the discharge port is stopped, and pulling up a portion of the liquid collection portion below the discharge port by a surface tension of the developer;

stopping the lifting the developer nozzle, and forming a pillar of the developer, which has an upwardly-tapered upper end, wherein the upwardly-tapered upper end is brought into contact with the opposing surface by the pulled-up portion of the liquid collection portion; and applying a shearing force to the pillar of the developer to shear the upwardly-tapered upper end of the pillar of the developer and separating the pillar of the developer from the opposing surface.

* * * * *